(12) United States Patent
Liao et al.

(10) Patent No.: US 7,632,104 B2
(45) Date of Patent: Dec. 15, 2009

(54) ELECTRONIC DEVICE AND ELASTIC SHEET UNIT THEREOF

(75) Inventors: Chi Cheng Liao, Taipei (TW); Fu Ming Chen, Taipei (TW)

(73) Assignee: ASUSTek Computer Inc., Taipei (TW)

( * ) Notice: Subject to any disclaimer, the term of this patent is extended or adjusted under 35 U.S.C. 154(b) by 0 days.

(21) Appl. No.: 12/172,886

(22) Filed: Jul. 14, 2008

(65) Prior Publication Data
US 2009/0035958 A1   Feb. 5, 2009

(30) Foreign Application Priority Data
Aug. 2, 2007   (TW) .............................. 96128379 A

(51) Int. Cl.
*H01R 12/00* (2006.01)
(52) U.S. Cl. .............................. 439/65; 439/66; 439/74; 439/862
(58) Field of Classification Search ............... 439/65, 439/66, 74, 862
See application file for complete search history.

(56) References Cited

U.S. PATENT DOCUMENTS

| | | | | |
|---|---|---|---|---|
| 4,445,735 A | * | 5/1984 | Bonnefoy | .................. 439/66 |
| 4,738,625 A | * | 4/1988 | Burton et al. | ................. 439/59 |
| 6,022,224 A | * | 2/2000 | Peters | .......................... 439/66 |
| 6,186,797 B1 | * | 2/2001 | Wang et al. | ................... 439/66 |
| 6,781,850 B2 | | 8/2004 | Maurer et al. | |
| 6,984,130 B2 | * | 1/2006 | Richter et al. | ................. 439/66 |
| 6,986,669 B2 | | 1/2006 | Kawai | |
| 2002/0182900 A1 | | 12/2002 | Brodsky et al. | |
| 2004/0033705 A1 | * | 2/2004 | Nelson | ........................ 439/66 |

FOREIGN PATENT DOCUMENTS

CN      2706902      6/2005

* cited by examiner

*Primary Examiner*—Tho D Ta
(74) *Attorney, Agent, or Firm*—Quintero Law Office

(57) ABSTRACT

An electronic device includes a body, a first circuit board, an electronic element set and an elastic sheet unit. The body includes a first surface, a second surface and at least one through hole. The first surface is opposite to the second surface. The through hole passes through the body. The first circuit board includes a first conductive portion. The electronic element set is provided at the first surface. The electronic element set includes a second conductive portion. The elastic sheet unit includes a fixing element and two elastic sheets. The fixing element fixes the elastic sheets on the second surface. Each of the elastic sheets includes a first end and a second end. The first ends abut the first conductive portion, and the second ends pass through the through hole to abut the second conductive portion.

15 Claims, 5 Drawing Sheets

US 7,632,104 B2

ELECTRONIC DEVICE AND ELASTIC SHEET UNIT THEREOF

CROSS REFERENCE TO RELATED APPLICATIONS

This application claims priority of Taiwan Patent Application No. 96128379, filed on Aug. 2, 2007, the entirety of incorporated by reference herein.

BACKGROUND OF THE INVENTION

1. Field of the Invention

The invention relates to an elastic sheet unit and, more particularly, to an elastic sheet unit capable of saving the element cost of an electronic device.

2. Description of the Related Art

FIG. 1a is a schematic diagram showing a conventional electronic device 1. The electronic device 1 includes a body 10, an electronic element 20, a circuit board 30 and a flexible circuit board 40. The body 10 is located between the electronic element 20 and the circuit board 30. The body 10 includes a through hole 11. A female connector 31 is provided on the circuit board 30. One end of the flexible circuit board 40 is directly connected to the electronic element 20, and a male connector 41 is provided at the other end of the flexible circuit board 40.

As shown in FIG. 1b, when the electronic device 1 is assembled, the flexible circuit board 40 passes through the through hole 11 and the male connector 41 is connected to the female connector 31. In this way, the electronic element 20 is coupled to the circuit board 30.

In the conventional technology, a flexible circuit board and two connectors need to be used to enable the electronic element 20 to be coupled to the circuit board 30, so that the cost is high, the space is wasted and the assembly defect radio is high.

BRIEF SUMMARY OF THE INVENTION

To solve the problem of the conventional technology, the invention provides an electronic device including a body, a first circuit board, an electronic element set and an elastic sheet unit. The body includes a first surface, a second surface and at least a through hole. The first surface is opposite to the second surface, and the through hole passes through the body. The first circuit board includes a first conductive portion. The electronic element set is provided at the first surface. The electronic element set includes a second conductive portion. The elastic sheet unit includes a fixing element and two elastic sheets, and the elastic sheets are fixed on the second surface by the fixing element. Each of the elastic sheets includes a first end and a second end. The first ends abut the first conductive portion, and the second ends pass through the through hole to abut the second conductive portion.

In the invention, since an elastic sheet unit is used to replace the flexible circuit board and the connectors, the element cost is reduced, the interior space of the electronic device is saved and the assembly defect radio is reduced.

DETAILED DESCRIPTION OF THE EMBODIMENTS

Figure 1A:
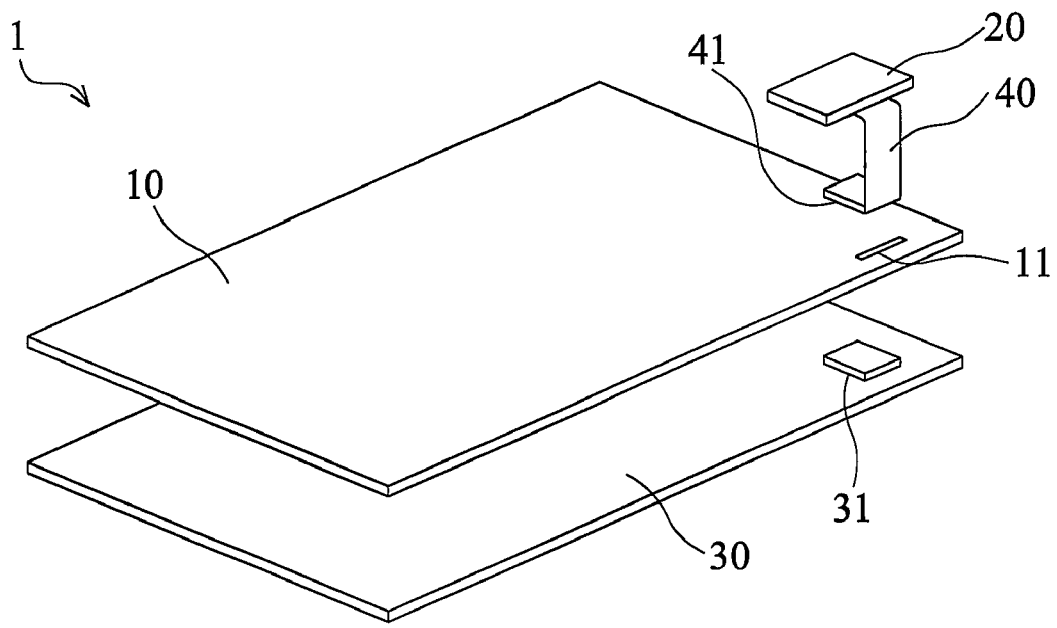
FIG. 1a is an exploded diagram showing a conventional electronic device.
Figure 1B:
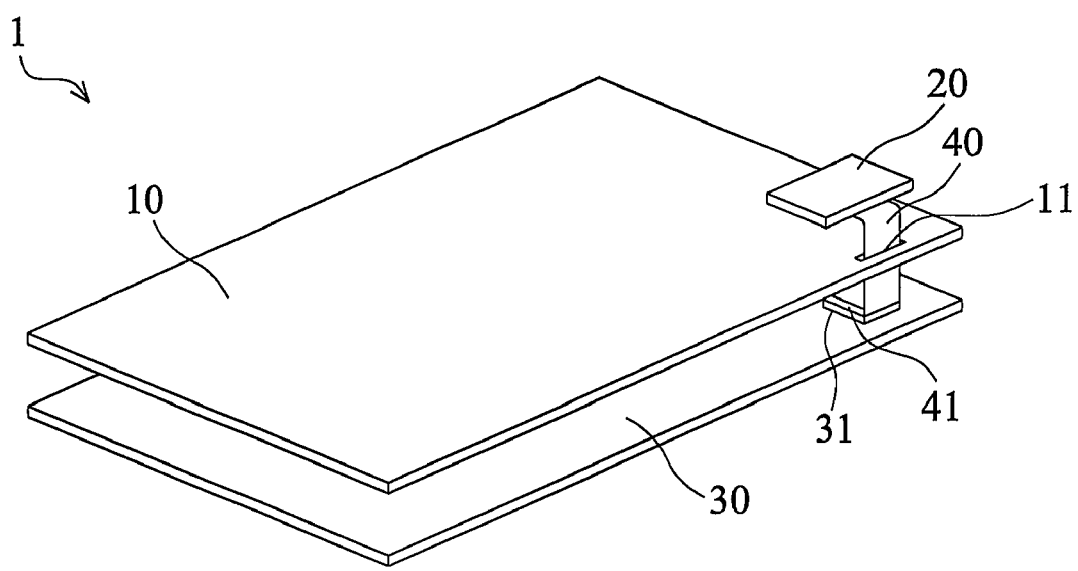
FIG. 1b is a schematic diagram showing the conventional electronic device whose male connector and female connector are connected to each other.
Figure 2:
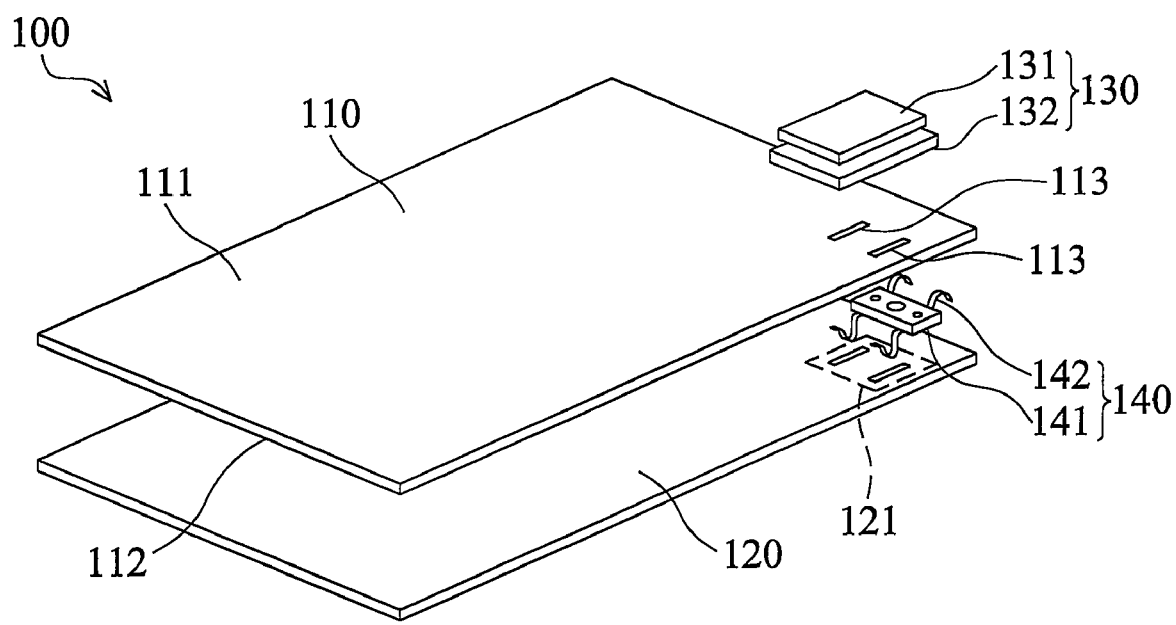
FIG. 2 is a schematic diagram showing an electronic device according to the first embodiment of the invention.

FIG. 2 is a schematic diagram showing an electronic device 100 according to the first embodiment of the invention. The electronic device 100 includes a body 110, a first circuit board 120, an electronic element set 130 and an elastic sheet unit 140. The body 110 includes a first surface 111, a second surface 112 and two through holes 113. The first surface 111 is opposite to the second surface 112, and the through holes 113 pass through the body 110. The first circuit board 120 includes a first conductive portion 121. The electronic element set 130 is provided at the first surface 111. The electronic element set 130 includes an electronic element 131 and a second circuit board 132. The elastic sheet unit 140 includes a fixing element 141 and two elastic sheets 142. The elastic sheets 142 are fixed on the second surface 112 by the fixing element 141 in a bolt locking mode.

Figure 3A:
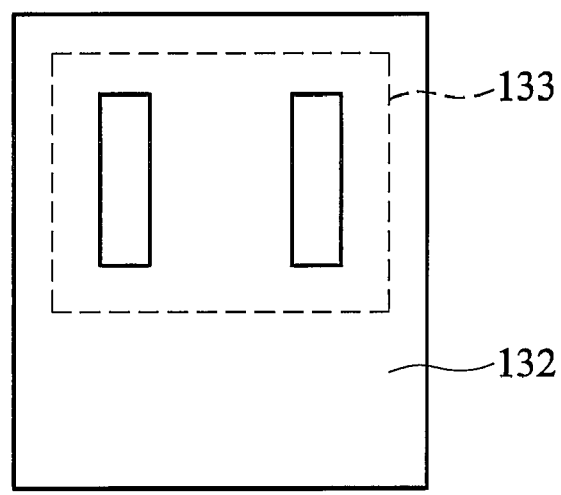
FIG. 3a is a schematic diagram showing the bottom side of a second circuit board.
Figure 3B:
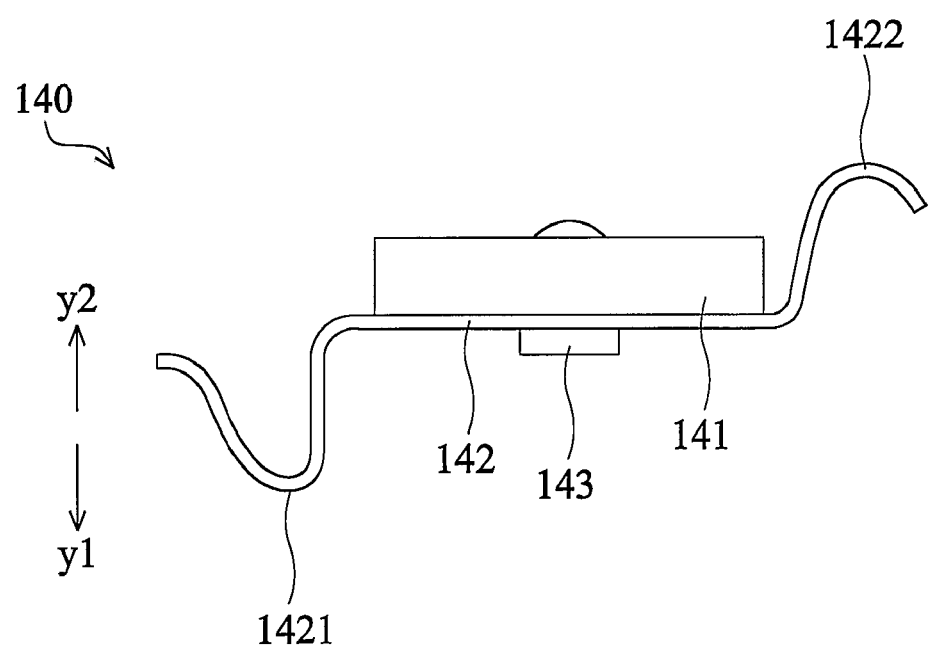
FIG. 3b is a lateral view showing an elastic sheet unit.

FIG. 3a is a schematic diagram showing the bottom side of the second circuit board 132 which includes a second conductive portion 133. FIG. 3b is a lateral view showing the elastic sheet unit 140. Each of the elastic sheets 142 includes a first end 1421 and a second end 1422. The first ends 1421 are bent towards a first direction y1, and the second ends 1422 are bent towards a second direction y2 opposite to the first direction y1. The first ends 1421 abut the first conductive portion 121, and the second ends 1422 pass through the through holes 113 to abut the second conductive portion 133. The elastic sheets 142 are fixed on the fixing element 141 via rivets 143 in a rivet connecting mode.

The electronic device 100 may be a mobile phone, a personal digital assistant or other portable electronic device.

In the invention, since the elastic sheet unit 140 is used to replace the flexible circuit board and the connectors, the element cost is reduced, the interior space of the electronic device is saved and the assembly defect ratio is reduced.

Figure 4:
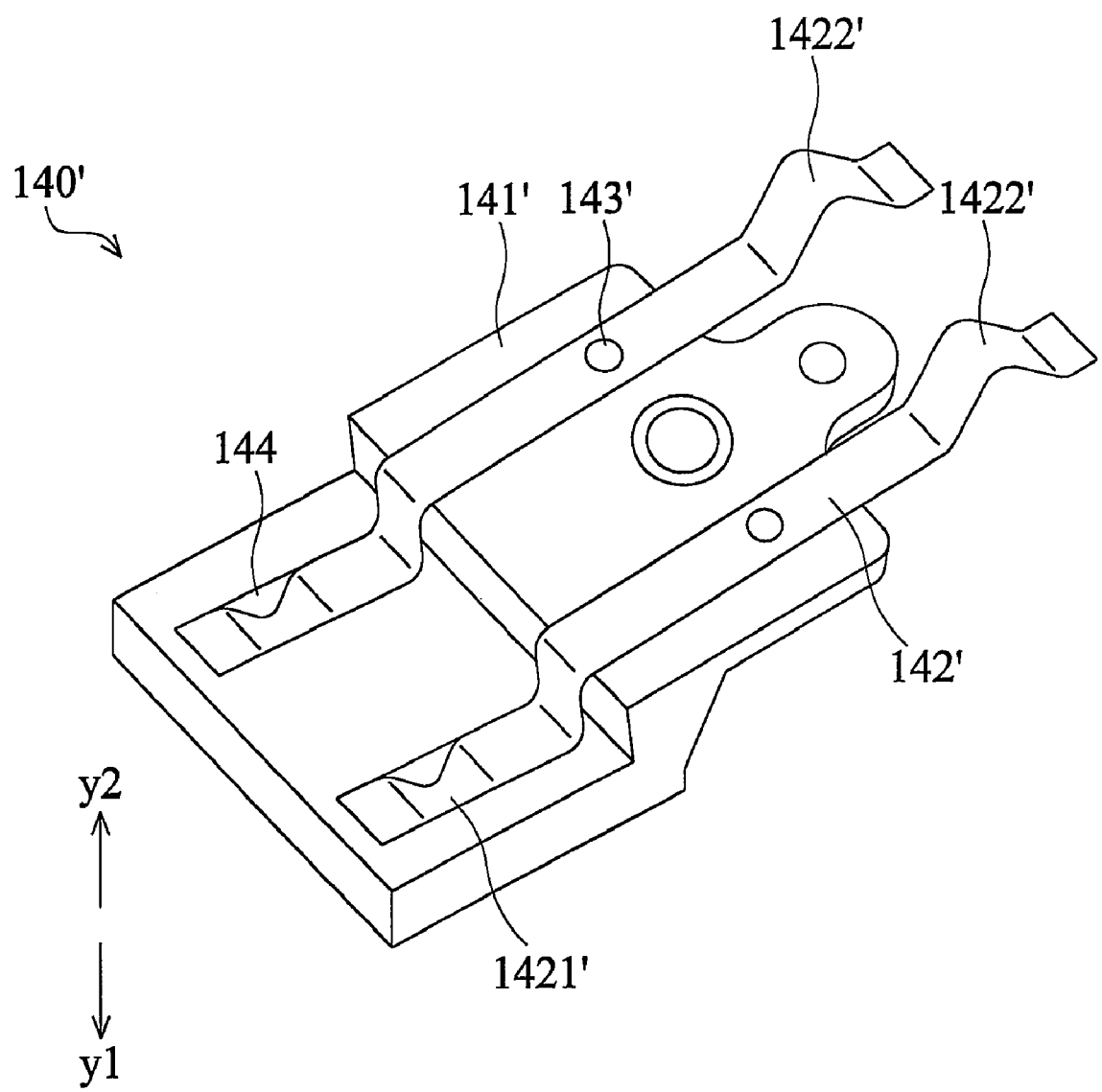
FIG. 4 is a schematic diagram showing an elastic sheet unit of the second embodiment of the invention.

FIG. 4 is a schematic diagram showing an elastic sheet unit 140' of the second embodiment of the invention. The elastic sheet unit 140' includes a fixing element 141' and elastic sheets 142'. Each of the elastic sheets 142' includes a first end 1421' and a second end 1422'. The first ends 1421' are bent towards a first direction y1, and the second ends 1422' are bent towards a second direction y2. The fixing element 141' further includes openings 144, and the first ends 1421' pass through the openings 144 to abut the first circuit board. The elastic sheets 142' are fixed on the fixing element 141' via rivets 143' in a rivet connecting mode.

Figure 5A:
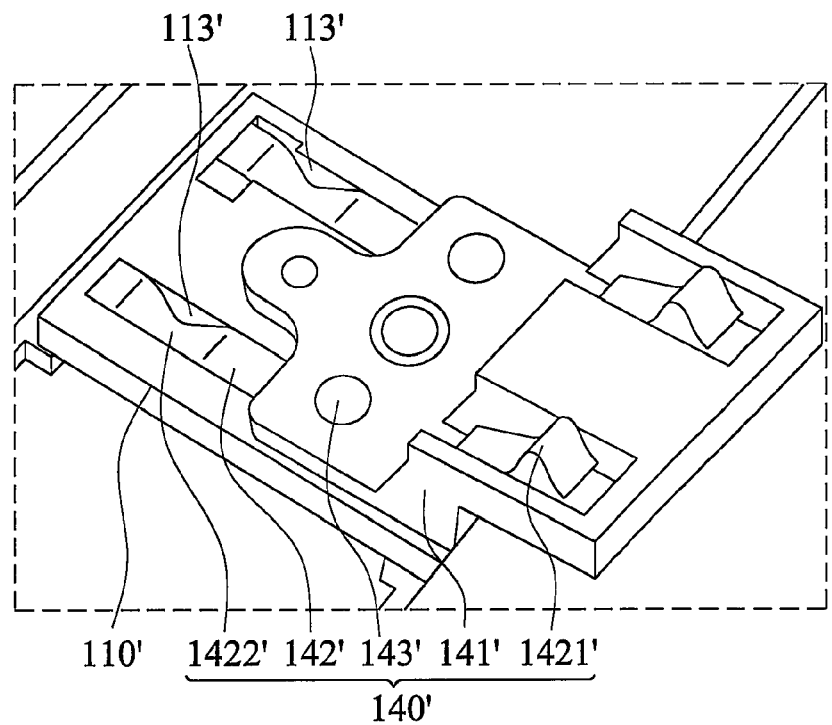
FIG. 5a and FIG. 5b are schematic diagrams showing that an elastic sheet unit is connected to a body according to the second embodiment.
Figure 5B:
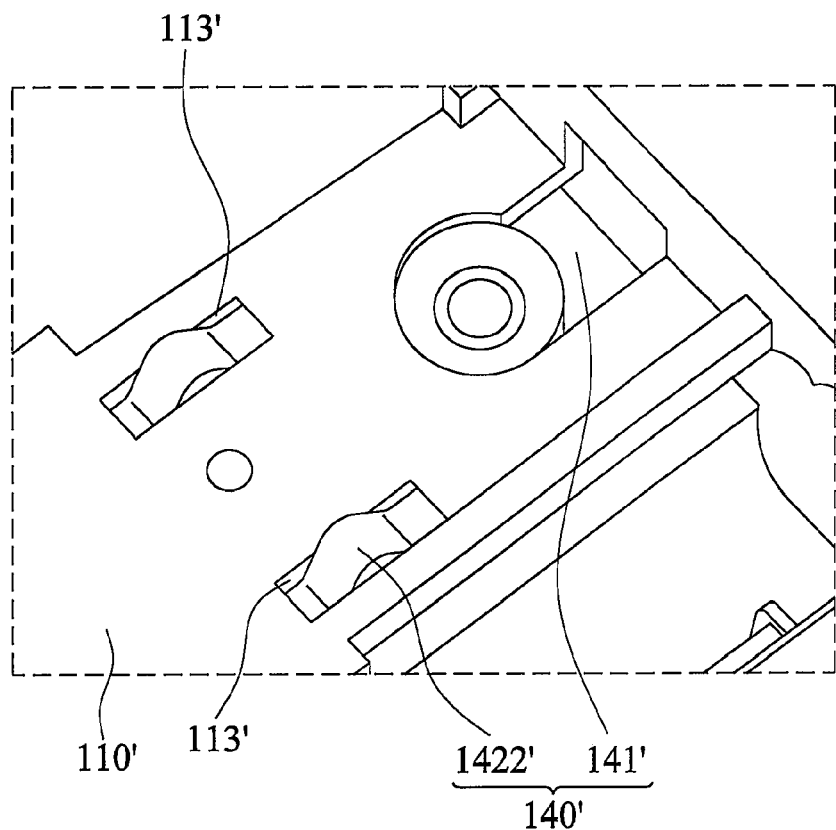

FIG. 5a is a schematic diagram showing that an elastic sheet unit 140' is connected to a body 110' according to the second embodiment. The second ends 1422' pass through the through holes 113' of the body 110' (as shown in FIG. 5b).

Although the present invention has been described in considerable detail with reference to certain preferred embodiments thereof, the disclosure is not for limiting the scope of the invention. Persons having ordinary skill in the art may make various modifications and changes without departing from the scope and spirit of the invention. Therefore, the scope of the appended claims should not be limited to the description of the preferred embodiments described above.

What is claimed is:

1. An electronic device comprising:
   a body comprising a first surface, a second surface and at least a through hole, wherein the first surface is opposite to the second surface, and the through hole passes through the body;
   a first circuit board comprising a first conductive portion;
   an electronic element set provided at the first surface and comprising a second conductive portion; and
   an elastic sheet unit comprising a fixing element and two elastic sheets, wherein the elastic sheets are fixed on the second surface by the fixing element, and each of the elastic sheet comprises a first end abutting the first conductive portion and a second end passing through the through hole to abut the second conductive portion.

2. The electronic device according to claim 1, wherein the fixing element is fixed on the body in a bolt locking mode.

3. The electronic device according to claim 1, wherein the first ends are bent towards a first direction, and the second ends are bent towards a second direction opposite to the first direction.

4. The electronic device according to claim 1, wherein the fixing element comprises at least an opening through which the first ends abut the first circuit board.

5. The electronic device according to claim 1, wherein the elastic sheets are fixed on the fixing element in a rivet connecting mode.

6. The electronic device according to claim 1, wherein the electronic element set comprises an electronic element and a second circuit board, the electronic, element is provided on the second circuit board, and the second conductive portion is located on the second circuit board.

7. The electronic device according to claim 1, wherein the electronic device is a mobile phone.

8. The electronic device according to claim 1, wherein the electronic device is a personal digital assistant.

9. An electronic device comprising: a body comprising a first surface, a second surface and at least a through hole, wherein the first surface is opposite to the second surface, and the through hole passes through the body;
   a first circuit board comprising a first conductive portion;
   a second circuit board provided at the first surface and comprising a second conductive portion; and
   an elastic sheet unit comprising a fixing element and two elastic sheets, wherein the elastic sheets are fixed on the second surface by the fixing element, and each of the elastic sheet comprises a first end abutting the first conductive portion and a second end passing through the through hole to abut the second conductive portion.

10. The electronic device according to claim 9, wherein the fixing element is fixed on the body in a bolt locking mode.

11. The electronic device according to claim 9, wherein the first ends are bent towards a first direction, and the second ends are bent towards a second direction opposite to the first direction.

12. The electronic device according to claim 9, wherein the fixing element comprises an opening through which the first ends abut the first circuit board.

13. The electronic device according to claim 9, wherein the elastic sheets are fixed on the fixing element in a rivet connecting mode.

14. The electronic device, according to claim 9, wherein the electronic device is a mobile phone.

15. The electronic device according to claim 9, wherein the electronic device is a personal digital assistant.

* * * * *